United States Patent
Laifenfeld

(10) Patent No.: US 11,681,028 B2
(45) Date of Patent: Jun. 20, 2023

(54) CLOSE-RANGE MEASUREMENT OF TIME OF FLIGHT USING PARALLAX SHIFT

(71) Applicant: APPLE INC., Cupertino, CA (US)

(72) Inventor: Moshe Laifenfeld, Haifa (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/512,708

(22) Filed: Oct. 28, 2021

(65) Prior Publication Data

US 2023/0016025 A1 Jan. 19, 2023

Related U.S. Application Data

(60) Provisional application No. 63/223,007, filed on Jul. 18, 2021.

(51) Int. Cl.
*G01S 7/486* (2020.01)
*G01S 7/4865* (2020.01)
(Continued)

(52) U.S. Cl.
CPC ............ *G01S 7/4865* (2013.01); *G01S 17/10* (2013.01); *H01L 31/02027* (2013.01); *H01L 31/107* (2013.01)

(58) Field of Classification Search
CPC .......... G01S 17/10; G01S 17/02; G01S 17/06; G01S 17/08; G01S 17/42; G01S 17/50;
(Continued)

(56) References Cited

U.S. PATENT DOCUMENTS

| | | |
|---|---|---|
| 4,623,237 A | 11/1986 | Kaneda et al. |
| 4,757,200 A | 7/1988 | Shepherd |

(Continued)

FOREIGN PATENT DOCUMENTS

| | | |
|---|---|---|
| CA | 2605339 C | 10/1994 |
| CN | 201054040 Y | 4/2008 |

(Continued)

OTHER PUBLICATIONS

CN Application # 201810571820.4 Office Action dated Sep. 9, 2022.

(Continued)

*Primary Examiner* — Que Tan Le
(74) *Attorney, Agent, or Firm* — Kligler & Associates Patent Attorneys Ltd

(57) ABSTRACT

An optical sensing device includes a light source, which emits one or more beams of light pulses toward a target scene at respective angles about a transmit axis of the light source. A first array of single-photon detectors output electrical pulses in response to photons that are incident thereon. A second array of counters count the electrical pulses output during respective count periods by respective sets of one or more of the single-photon detectors. Light collection optics form an image of the target scene on the first array along a receive axis, which is offset transversely relative to the transmit axis, thereby giving rise to a parallax shift as a function of distance between the target scene and the device. Control circuitry sets the respective count periods of the counters, responsively to the parallax shift, to cover different, respective time intervals following each of the light pulses.

20 Claims, 5 Drawing Sheets

(51) Int. Cl.
  *H01L 31/02* (2006.01)
  *H01L 31/107* (2006.01)
  *G01S 17/10* (2020.01)

(58) Field of Classification Search
  CPC . G01S 17/66; G01S 17/88; G01S 7/48; G01S 17/00; H01L 27/146; H01L 31/107
  USPC .................................. 250/214 R, 221, 208.1
  See application file for complete search history.

(56) References Cited

U.S. PATENT DOCUMENTS

| | | |
|---|---|---|
| 5,164,823 A | 11/1992 | Keeler |
| 5,270,780 A | 12/1993 | Moran et al. |
| 5,373,148 A | 12/1994 | Dvorkis et al. |
| 5,699,149 A | 12/1997 | Kuroda et al. |
| 6,301,003 B1 | 10/2001 | Shirai et al. |
| 6,384,903 B1 | 5/2002 | Fuller |
| 6,710,859 B2 | 3/2004 | Shirai et al. |
| 7,126,218 B1 | 10/2006 | Darveaux et al. |
| 7,193,690 B2 | 3/2007 | Ossig et al. |
| 7,303,005 B2 | 12/2007 | Reis et al. |
| 7,405,812 B1 | 7/2008 | Bamji |
| 7,508,496 B2 | 3/2009 | Mettenleiter et al. |
| 7,800,067 B1 | 9/2010 | Rajavel et al. |
| 7,800,739 B2 | 9/2010 | Rohner et al. |
| 7,812,301 B2 | 10/2010 | Oike et al. |
| 7,969,558 B2 | 6/2011 | Hall |
| 8,193,482 B2 | 6/2012 | Itsler |
| 8,259,293 B2 | 9/2012 | Andreou |
| 8,275,270 B2 | 9/2012 | Shushakov et al. |
| 8,279,418 B2 * | 10/2012 | Yee .................. G01S 17/66 356/3.01 |
| 8,355,117 B2 | 1/2013 | Niclass |
| 8,405,020 B2 | 3/2013 | Menge |
| 8,594,425 B2 | 11/2013 | Gurman et al. |
| 8,675,181 B2 | 3/2014 | Hall |
| 8,736,818 B2 | 5/2014 | Weimer et al. |
| 8,766,164 B2 | 7/2014 | Sanfilippo et al. |
| 8,766,808 B2 | 7/2014 | Hogasten |
| 8,891,068 B2 | 11/2014 | Eisele et al. |
| 8,925,814 B1 | 1/2015 | Schneider et al. |
| 8,963,069 B2 | 2/2015 | Drader et al. |
| 9,002,511 B1 | 4/2015 | Hickerson et al. |
| 9,024,246 B2 | 5/2015 | Jiang et al. |
| 9,052,356 B2 | 6/2015 | Chu et al. |
| 9,076,707 B2 | 7/2015 | Harmon |
| 9,016,849 B2 | 8/2015 | Duggal et al. |
| 9,267,787 B2 | 2/2016 | Shpunt et al. |
| 9,335,220 B2 | 5/2016 | Shpunt et al. |
| 9,354,332 B2 | 5/2016 | Zwaans et al. |
| 9,465,111 B2 | 10/2016 | Wilks et al. |
| 9,516,248 B2 | 12/2016 | Cohen et al. |
| 9,709,678 B2 | 7/2017 | Matsuura |
| 9,736,459 B2 | 8/2017 | Mor et al. |
| 9,739,881 B1 | 8/2017 | Pavek et al. |
| 9,761,049 B2 | 9/2017 | Naegle et al. |
| 9,786,701 B2 | 10/2017 | Mellot et al. |
| 9,810,777 B2 | 11/2017 | Williams et al. |
| 9,874,635 B1 | 1/2018 | Eichenholz et al. |
| 10,063,844 B2 | 8/2018 | Adam et al. |
| 10,067,224 B2 | 9/2018 | Moore et al. |
| 10,132,616 B2 | 11/2018 | Wang |
| 10,215,857 B2 | 2/2019 | Oggier et al. |
| 10,269,104 B2 | 4/2019 | Hannuksela et al. |
| 10,386,487 B1 | 8/2019 | Wilton et al. |
| 10,424,683 B1 | 9/2019 | Do Valle et al. |
| 10,613,203 B1 | 4/2020 | Rekow et al. |
| 10,782,393 B2 | 9/2020 | Dussan et al. |
| 2001/0020673 A1 | 9/2001 | Zappa et al. |
| 2002/0071126 A1 | 6/2002 | Shirai et al. |
| 2002/0131035 A1 | 9/2002 | Watanabe et al. |
| 2002/0154054 A1 | 10/2002 | Small |
| 2002/0186362 A1 | 12/2002 | Shirai et al. |
| 2004/0051859 A1 | 3/2004 | Flockencier |
| 2004/0135992 A1 | 7/2004 | Munro |
| 2004/0212863 A1 | 10/2004 | Schanz et al. |
| 2006/0044546 A1 | 3/2006 | Lewin et al. |
| 2006/0106317 A1 | 5/2006 | McConnell et al. |
| 2007/0145136 A1 | 6/2007 | Wiklof et al. |
| 2009/0009747 A1 | 1/2009 | Wolf et al. |
| 2009/0262760 A1 | 10/2009 | Krupkin et al. |
| 2009/0273770 A1 | 11/2009 | Bauhahn et al. |
| 2009/0275841 A1 | 11/2009 | Melendez et al. |
| 2010/0019128 A1 | 1/2010 | Itzler |
| 2010/0045965 A1 | 2/2010 | Meneely |
| 2010/0096459 A1 | 4/2010 | Gurevich |
| 2010/0121577 A1 | 5/2010 | Zhang et al. |
| 2010/0250189 A1 | 9/2010 | Brown |
| 2010/0286516 A1 | 11/2010 | Fan et al. |
| 2011/0006190 A1 | 1/2011 | Alameh et al. |
| 2011/0128524 A1 | 6/2011 | Vert et al. |
| 2011/0181864 A1 | 7/2011 | Schmitt et al. |
| 2012/0038904 A1 | 2/2012 | Fossum et al. |
| 2012/0075615 A1 | 3/2012 | Niclass et al. |
| 2012/0132636 A1 | 5/2012 | Moore |
| 2012/0153120 A1 | 6/2012 | Baxter |
| 2012/0154542 A1 | 6/2012 | Katz et al. |
| 2012/0176476 A1 | 7/2012 | Schmidt et al. |
| 2012/0249998 A1 | 10/2012 | Eisele et al. |
| 2012/0287242 A1 | 11/2012 | Gilboa et al. |
| 2012/0294422 A1 | 11/2012 | Cheung et al. |
| 2013/0015331 A1 | 1/2013 | Birk et al. |
| 2013/0079639 A1 | 3/2013 | Hoctor et al. |
| 2013/0092846 A1 | 4/2013 | Henning et al. |
| 2013/0107016 A1 | 5/2013 | Federspiel |
| 2013/0208258 A1 | 8/2013 | Eisele et al. |
| 2013/0236171 A1 | 9/2013 | Saunders |
| 2013/0258099 A1 | 10/2013 | Ovsiannikov et al. |
| 2013/0278917 A1 | 10/2013 | Korekado et al. |
| 2013/0300838 A1 | 11/2013 | Borowski |
| 2013/0342835 A1 | 12/2013 | Blacksberg |
| 2014/0027606 A1 | 1/2014 | Raynor et al. |
| 2014/0071433 A1 | 3/2014 | Eisele et al. |
| 2014/0077086 A1 | 3/2014 | Batkilin et al. |
| 2014/0078491 A1 | 3/2014 | Eisele et al. |
| 2014/0162714 A1 | 6/2014 | Kim et al. |
| 2014/0191115 A1 | 7/2014 | Webster et al. |
| 2014/0198198 A1 | 7/2014 | Geissbuehler et al. |
| 2014/0231630 A1 | 8/2014 | Rae et al. |
| 2014/0240317 A1 | 8/2014 | Go et al. |
| 2014/0240691 A1 | 8/2014 | Mheen et al. |
| 2014/0268127 A1 | 9/2014 | Day |
| 2014/0300907 A1 | 10/2014 | Kimmel |
| 2014/0321862 A1 | 10/2014 | Frohlich et al. |
| 2014/0353471 A1 | 12/2014 | Raynor et al. |
| 2015/0041625 A1 | 2/2015 | Dutton et al. |
| 2015/0062558 A1 | 3/2015 | Koppal et al. |
| 2015/0131080 A1 | 5/2015 | Retterath et al. |
| 2015/0163429 A1 | 6/2015 | Dai et al. |
| 2015/0192676 A1 | 7/2015 | Kotelnikov et al. |
| 2015/0200222 A1 | 7/2015 | Webster |
| 2015/0200314 A1 | 7/2015 | Webster |
| 2015/0260830 A1 | 9/2015 | Gosh et al. |
| 2015/0285625 A1 | 10/2015 | Deane et al. |
| 2015/0362585 A1 | 12/2015 | Gosh et al. |
| 2015/0373322 A1 | 12/2015 | Goma et al. |
| 2016/0003944 A1 | 1/2016 | Schmidtke et al. |
| 2016/0041266 A1 | 2/2016 | Smits |
| 2016/0072258 A1 | 3/2016 | Seurin et al. |
| 2016/0080709 A1 | 3/2016 | Viswanathan et al. |
| 2016/0259038 A1 | 9/2016 | Retterath et al. |
| 2016/0259057 A1 | 9/2016 | Ito |
| 2016/0274222 A1 | 9/2016 | Yeun |
| 2016/0334508 A1 | 11/2016 | Hall et al. |
| 2016/0344965 A1 | 11/2016 | Grauer |
| 2017/0006278 A1 | 1/2017 | Vandame et al. |
| 2017/0038459 A1 | 2/2017 | Kubacki et al. |
| 2017/0052065 A1 | 2/2017 | Sharma et al. |
| 2017/0067734 A1 | 3/2017 | Heidemann et al. |
| 2017/0131388 A1 | 5/2017 | Campbell et al. |
| 2017/0131718 A1 | 5/2017 | Matsumura et al. |
| 2017/0139041 A1 | 5/2017 | Drader et al. |
| 2017/0176577 A1 | 6/2017 | Halliday |

(56) References Cited

U.S. PATENT DOCUMENTS

| | | |
|---|---|---|
| 2017/0176579 A1 | 6/2017 | Niclass et al. |
| 2017/0179173 A1 | 6/2017 | Mandai et al. |
| 2017/0184450 A1 | 6/2017 | Doylend et al. |
| 2017/0184704 A1 | 6/2017 | Yang et al. |
| 2017/0184709 A1 | 6/2017 | Kenzler et al. |
| 2017/0188016 A1 | 6/2017 | Hudman |
| 2017/0219695 A1 | 8/2017 | Hall et al. |
| 2017/0242102 A1 | 8/2017 | Dussan et al. |
| 2017/0242108 A1 | 8/2017 | Dussan et al. |
| 2017/0257617 A1 | 9/2017 | Retterath |
| 2017/0269209 A1 | 9/2017 | Hall et al. |
| 2017/0303789 A1 | 10/2017 | Tichauer et al. |
| 2017/0329010 A1 | 11/2017 | Warke et al. |
| 2017/0343675 A1 | 11/2017 | Oggier et al. |
| 2017/0356796 A1 | 12/2017 | Nishio |
| 2017/0356981 A1 | 12/2017 | Yang et al. |
| 2018/0045816 A1 | 2/2018 | Jarosinski et al. |
| 2018/0059220 A1 | 3/2018 | Irish et al. |
| 2018/0062345 A1 | 3/2018 | Bills et al. |
| 2018/0081032 A1 | 3/2018 | Torruellas et al. |
| 2018/0081041 A1 | 3/2018 | Niclass et al. |
| 2018/0115762 A1 | 4/2018 | Bulteel et al. |
| 2018/0131449 A1 | 5/2018 | Kare et al. |
| 2018/0167602 A1 | 6/2018 | Pacala et al. |
| 2018/0203247 A1 | 7/2018 | Chen et al. |
| 2018/0205943 A1 | 7/2018 | Trail |
| 2018/0209846 A1 | 7/2018 | Mandai et al. |
| 2018/0259645 A1 | 9/2018 | Shu et al. |
| 2018/0299554 A1 | 10/2018 | Van Dyck et al. |
| 2018/0341009 A1 | 11/2018 | Niclass et al. |
| 2019/0004156 A1 | 1/2019 | Niclass et al. |
| 2019/0011556 A1 | 1/2019 | Pacala et al. |
| 2019/0011567 A1 | 1/2019 | Pacala et al. |
| 2019/0018117 A1 | 1/2019 | Perenzoni et al. |
| 2019/0018118 A1 | 1/2019 | Perenzoni et al. |
| 2019/0018119 A1 | 1/2019 | Laifenfeld et al. |
| 2019/0018143 A1 | 1/2019 | Thayer et al. |
| 2019/0037120 A1 | 1/2019 | Ohki |
| 2019/0056497 A1 | 2/2019 | Pacala et al. |
| 2019/0094364 A1 | 3/2019 | Fine et al. |
| 2019/0170855 A1 | 6/2019 | Keller et al. |
| 2019/0178995 A1 | 6/2019 | Tsai et al. |
| 2019/0257950 A1 | 8/2019 | Patanwala et al. |
| 2019/0277952 A1 | 9/2019 | Beuschel et al. |
| 2019/0361404 A1 | 11/2019 | Mautner et al. |
| 2020/0142033 A1 | 5/2020 | Shand |
| 2020/0233068 A1 | 7/2020 | Henderson et al. |
| 2020/0256669 A1 | 8/2020 | Roth et al. |
| 2020/0256993 A1 | 8/2020 | Oggier |
| 2020/0309955 A1 | 10/2020 | Laflaqueire et al. |
| 2020/0314294 A1 | 10/2020 | Schoenlieb et al. |
| 2020/0386890 A1 | 10/2020 | Oggier et al. |
| 2021/0164776 A1 | 6/2021 | Roth et al. |
| 2021/0165083 A1 | 6/2021 | Fine et al. |

FOREIGN PATENT DOCUMENTS

| | | |
|---|---|---|
| CN | 103763485 A | 4/2014 |
| CN | 104730535 A | 6/2015 |
| CN | 104914446 A | 9/2015 |
| CN | 105992960 A | 10/2016 |
| CN | 106405572 A | 2/2017 |
| CN | 110609293 A | 12/2019 |
| DE | 202013101039 U1 | 3/2014 |
| EP | 2157445 A2 | 2/2010 |
| EP | 2322953 A1 | 5/2011 |
| EP | 2469297 A1 | 6/2012 |
| EP | 2477043 A1 | 7/2012 |
| EP | 2827175 A2 | 1/2015 |
| EP | 3285087 A1 | 2/2018 |
| EP | 3318895 A1 | 5/2018 |
| EP | 3521856 A1 | 8/2019 |
| JP | H02287113 A | 11/1990 |
| JP | H0567195 A | 3/1993 |
| JP | 09197045 A | 7/1997 |
| JP | H10170637 A | 6/1998 |
| JP | H11063920 A | 3/1999 |
| JP | 2011089874 A | 5/2011 |
| JP | 2011237215 A | 11/2011 |
| JP | 2013113669 A | 6/2013 |
| JP | 2014059301 A | 4/2014 |
| KR | 101318951 B1 | 10/2013 |
| WO | 9008946 A1 | 8/1990 |
| WO | 2010149593 A1 | 12/2010 |
| WO | 2012154356 A1 | 11/2012 |
| WO | 2013028691 A1 | 2/2013 |
| WO | 2015199615 A1 | 12/2015 |
| WO | 2017106875 A1 | 6/2017 |
| WO | 2018122560 A1 | 7/2018 |
| WO | 2020101576 A1 | 5/2020 |
| WO | 2020109378 A1 | 6/2020 |
| WO | 2020201452 A1 | 10/2020 |

OTHER PUBLICATIONS

KR Application # 1020220101419 Office Action dated Sep. 28, 2022.

U.S. Appl. No. 17/026,365 Office Action dated Nov. 7, 2022.

U.S. Appl. No. 16/532,513 Office Action dated Nov. 23, 2022.

U.S. Appl. No. 16/679,360 Office Action dated Jun. 29, 2022.

EP Application # 22167103.5 Search Report dated Jul. 11, 2022.

CN Application # 201780058088.4 Office Action dated Aug. 23, 2022.

U.S. Appl. No. 16/885,316 Office Action dated Jun. 30, 2022.

U.S. Appl. No. 16/532,513 Office Action dated Aug. 4, 2022.

Charbon et al., "SPAD-Based Sensors", TOF Range-Imaging Cameras, Springer-Verlag, pp. 11-38, year 2013.

Niclass et al., "A 0.18 um CMOS SoC for a 100m range, 10 fps 200×96 pixel Time of Flight depth sensor", IEEE International Solid- State Circuits Conference- (ISSCC), Session 27, Image Sensors, 27.6, pp. 488-490, Feb. 20, 2013.

Walker et al., "A 128×96 pixel event-driven phase-domain $\Delta\Sigma$-based fully digital 3D camera in 0.13μm CMOS imaging technology", IEEE International Solid- State Circuits Conference- (ISSCC), Session 23, Image Sensors, 23.6, pp. 410-412, Feb. 23, 2011.

Niclass et al., "Design and characterization of a 256×64-pixel single-photon imager in CMOS for a MEMS-based laser scanning time-of-flight sensor", Optics Express, vol. 20, issue 11, pp. 11863-11881, May 21, 2012.

Kota et al., "System Design and Performance Characterization of a MEMS-Based Laser Scanning Time-of-Flight Sensor Based on a 256 × 64-pixel Single-Photon Imager", IEEE Photonics Journal, vol. 5, issue 2, pp. 1-15, Apr. 2013.

Webster et al., "A silicon photomultiplier with >30% detection efficiency from 450-750nm and 11.6μm pitch NMOS-only pixel with 21.6% fill factor in 130nm CMOS", Proceedings of the European Solid-State Device Research Conference (ESSDERC), pp. 238-241, Sep. 7-21, 2012.

Bradski et al., "Learning OpenCV", first edition, pp. 1-50, O'Reilly Media, Inc, California, USA, year 2008.

Buttgen et al., "Pseudonoise Optical Modulation for Real-Time 3-D Imaging With Minimum Interference", IEEE Transactions on Circuits and Systems I: Regular Papers, vol. 54, Issue10, pp. 2109-2119, Oct. 1, 2007.

Morbi et al., "Short range spectral lidar using mid-infrared semiconductor laser with code-division multiplexing technique", Technical Digest, CLEO 2001, pp. 491-492, May 2001.

Al et al., "High-resolution random-modulation cw lidar", Applied Optics, vol. 50, issue 22, pp. 4478-4488, Jul. 28, 2011.

Chung et al., "Optical orthogonal codes: design, analysis and applications", IEEE Transactions on Information Theory, vol. 35, issue 3, pp. 595-604, May 1989.

Lin et al., "Chaotic lidar", IEEE Journal of Selected Topics in Quantum Electronics, vol. 10, issue 5, pp. 991-997, Sep.-Oct. 2004.

Zhu Jian, "Research of Simulation of Super-Resolution Reconstruction of Infrared Image", abstract page, Master's Thesis, p. 1, Nov. 15, 2005.

Laifenfeld et al., U.S. Appl. No. 17/189,300, filed Mar. 2, 2021.

(56) References Cited

OTHER PUBLICATIONS

IN Application # 202117029897 Office Action dated Mar. 10, 2022.
IN Application # 202117028974 Office Action dated Mar. 2, 2022.
U.S. Appl. No. 17/079,548 Office Action dated Mar. 3, 2023.
CN Application # 201780097602.5 Office Action dated Mar. 15, 2023.
CN Application # 202010063812.6 Office Action dated Mar. 18, 2023.
KR Application # 1020217025136 Office Action dated Apr. 4, 2023.
U.S. Appl. No. 17/026,365 Office Action dated Jan. 26, 2023.

* cited by examiner

US 11,681,028 B2

CLOSE-RANGE MEASUREMENT OF TIME OF FLIGHT USING PARALLAX SHIFT

CROSS-REFERENCE TO RELATED APPLICATION

This application claims the benefit of U.S. Provisional Patent Application 63/223,007, filed Jul. 18, 2021, whose disclosure is incorporated herein by reference.

FIELD OF THE INVENTION

The present invention relates generally to depth mapping, and particularly to devices and methods for depth mapping based on sensing of time of flight (ToF).

BACKGROUND

Time-of-flight (ToF) imaging techniques are used in many depth mapping systems (also referred to as 3D mapping or 3D imaging systems). In direct ToF techniques, a light source, such as a pulsed laser, directs pulses of optical radiation toward the scene that is to be mapped, and a high-speed detector senses the time of arrival of the radiation reflected from the scene. (The terms "light" and "illumination," as used in the context of the present description and in the claims, refer to optical radiation in any or all of the visible, infrared, and ultraviolet ranges.) The depth value at each pixel in the depth map is derived from the difference between the emission time of the outgoing pulse and the arrival time of the reflected radiation from the corresponding point in the scene, which is referred to as the "time of flight" of the optical pulses. The radiation pulses that are reflected back and received by the detector are also referred to as "echoes."

Some ToF-based depth mapping systems use detectors based on single-photon avalanche diode (SPAD) arrays. SPADs, also known as Geiger-mode avalanche photodiodes (GAPDs), are detectors capable of capturing individual photons with very high time-of-arrival resolution, of the order of a few tens of picoseconds. They may be fabricated in dedicated semiconductor processes or in standard CMOS technologies. Arrays of SPAD sensors, fabricated on a single chip, have been used experimentally in 3D imaging cameras.

For efficient detection, SPAD arrays may be integrated with dedicated processing circuits. For example, U.S. Patent Application Publication 2017/0052065, whose disclosure is incorporated herein by reference, describes a sensing device that includes a first array of sensing elements (such as SPADs), which output a signal indicative of a time of incidence of a single photon on the sensing element. A second array of processing circuits are coupled respectively to the sensing elements and comprise a gating generator, which variably sets a start time of the gating interval for each sensing element within each acquisition period, and a memory, which records the time of incidence of the single photon on each sensing element in each acquisition period. A controller processes a histogram of respective counts over different time bins for each sensing element so as to derive and output a respective time-of-arrival value for the sensing element.

U.S. Pat. No. 10,830,879, whose disclosure is incorporated herein by reference, describes ToF depth mapping with parallax compensation. An optical sensing device includes a light source, which is configured to emit one or more beams of light pulses at respective angles toward a target scene. An array of sensing elements is configured to output signals in response to incidence of photons on the sensing elements. Light collection optics are configured to image the target scene onto the array. Control circuitry is coupled to actuate the sensing elements only in one or more selected regions of the array, each selected region containing a respective set of the sensing elements in a part of the array onto which the light collection optics image a corresponding area of the target scene that is illuminated by the one of the beams, and to adjust a membership of the respective set responsively to a distance of the corresponding area from the device.

SUMMARY

Embodiments of the present invention that are described hereinbelow provide improved devices and methods for ToF-based depth mapping.

There is therefore provided, in accordance with an embodiment of the invention, an optical sensing device, including a light source, which is configured to emit one or more beams of light pulses toward a target scene at respective angles about a transmit axis of the light source. A first array of single-photon detectors are configured to output electrical pulses in response to photons that are incident thereon. A second array of counters are coupled to count the electrical pulses output during respective count periods by respective sets of one or more of the single-photon detectors. Light collection optics are configured to form an image of the target scene on the first array along a receive axis, which is offset transversely relative to the transmit axis, thereby giving rise to a parallax shift as a function of distance between the target scene and the device. Control circuitry is configured to set the respective count periods of the counters, responsively to the parallax shift, to cover different, respective time intervals following each of the light pulses.

In some embodiments, the light collection optics are configured to image a respective area of the target scene that is illuminated any given beam among the one or more beams onto a respective region containing a plurality of the single-photon detectors in the first array, and the control circuitry is configured, responsively to the parallax shift, to apply the different time intervals in setting the counters that are coupled to different, respective sets of the single-photon detectors within the respective region. In the disclosed embodiments, the respective region in the first array is elongated due to the parallax shift, and the plurality of the singe-photon detectors includes at least a first single-photon detector at a first end of the elongated region and at least a second single-photon detector at a second end of the elongated region, opposite the first end. The control circuitry is configured to initiate a first count period of a first counter that is coupled to the first single-photon detector at an earlier start time following each of the light pulses than a second count period of a second counter that is coupled to the second single-photon detector.

In one embodiment, the control circuitry is configured to initiate the respective count periods of one or more of the counters that are coupled to one or more of the single-photon detectors that are disposed within the elongated region between the first and second single-photon detectors at respective start times that are graduated between the first and second count periods.

Additionally or alternatively, the control circuitry is configured to cause the first counter to aggregate and count all the electrical pulses output by the first single-photon detector during the first count period, while causing at least the second counter to count the electrical pulses in different time bins within the second count period so as to generate a histogram of the electrical pulses.

Further additionally or alternatively, the elongated region in the first array is defined such that the light collecting optics image objects disposed at a short distance from the device within the respective area of the target scene that is illuminated by the given beam onto the first end of the elongated region, while imaging objects disposed at a long distance from the device within the respective area of the target scene that is illuminated by the given beam onto the second end of the elongated region.

In some embodiments, the control circuitry is configured to process count values generated by the counters during the respective count periods in order to compute a depth map of the target scene using times of flight of the photons that are incident on the first array together with triangulation based on the parallax shift.

In a disclosed embodiment, the single-photon detectors include single-photon avalanche diodes (SPADs). Additionally or alternatively, the light source includes a plurality of emitters, which are configured to emit a corresponding plurality of the beams concurrently toward different, respective areas of the target scene.

In one embodiment, each of the counters is configured to aggregate and count the electrical pulses output by a respective set of two or more of the single-photon detectors that are mutually adjacent in the first array.

There is also provided, in accordance with an embodiment of the invention, a method for optical sensing, which includes emitting one or more beams of light pulses toward a target scene at respective angles about a transmit axis, and forming an image of the target scene on a first array of single-photon detectors along a receive axis, which is offset transversely relative to the transmit axis, thereby giving rise to a parallax shift as a function of distance to the target scene. Electrical pulses that are output by respective sets of one or more of the single-photon detectors in response to photons that are incident thereon are counted during respective count periods. The respective count periods are set, responsively to the parallax shift, to cover different, respective time intervals following each of the light pulses.

The present invention will be more fully understood from the following detailed description of the embodiments thereof, taken together with the drawings in which:

DETAILED DESCRIPTION OF EMBODIMENTS

Overview

Figure 1:
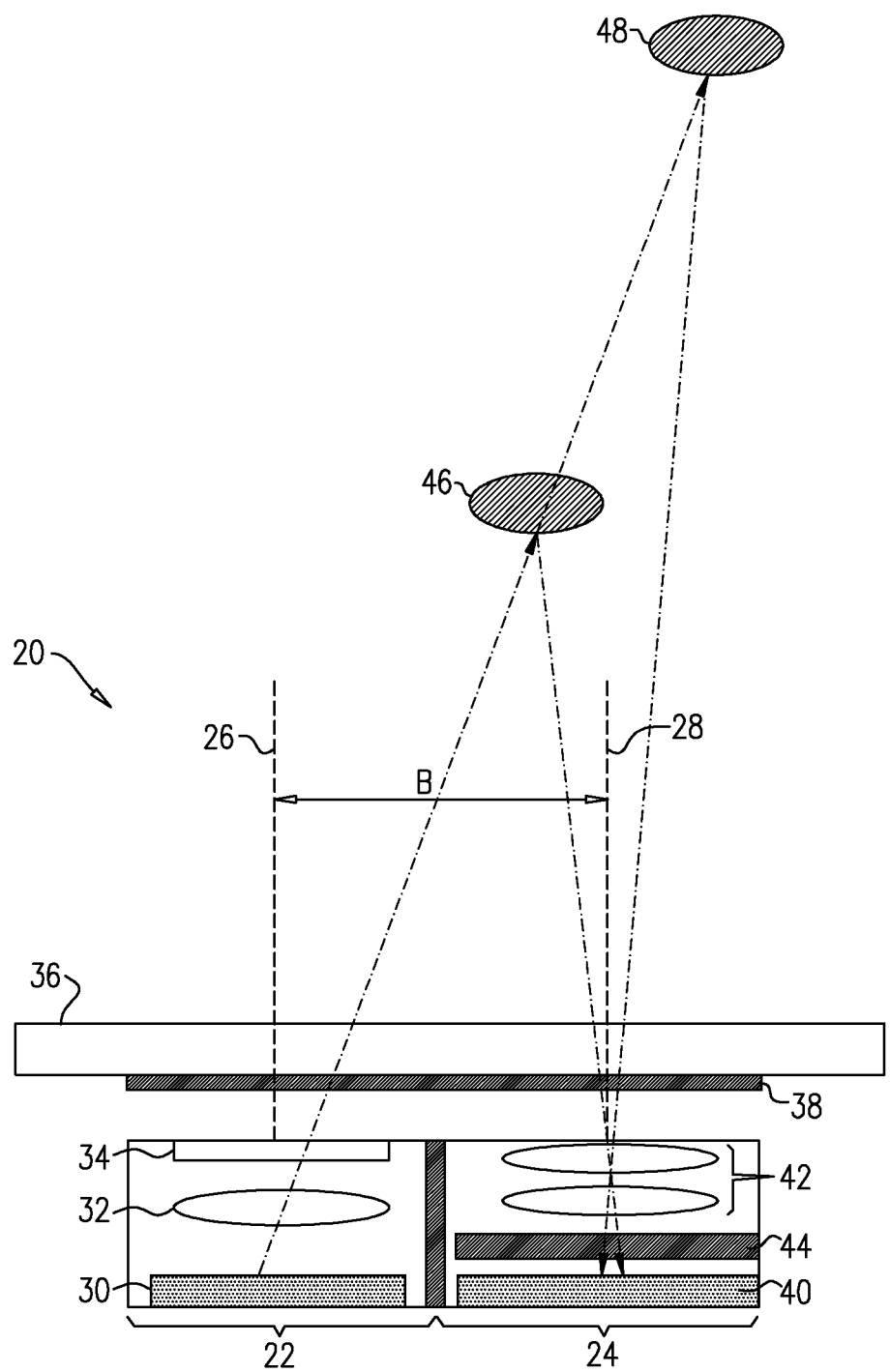
FIG. 1 is a schematic side view of a depth mapping device, in accordance with an embodiment of the invention.

ToF-based systems generally work best in mapping target scenes at relatively long ranges, in which the times of flight of photons to and from the scene are in the tens of nanoseconds or more. At shorter distances, the ToF measurements can be distorted due to the high intensity of the reflected light pulses, as well as by stray reflections of the transmitted beam and by systematic biases, whose effect becomes more marked as ToF decreases. Furthermore, in bistatic configurations, in which there is a transverse offset between the transmit and receive axes of the system, short-range ToF measurements will also be affected by parallax shift of the reflected light, which increases as the distance to the target scene decreases.

Embodiments of the present invention that are described herein use this parallax shift to advantage, in order to enhance the short-range accuracy of a bistatic ToF-based depth sensing device. The device comprises a light source, which emits one or more beams of light pulses toward a scene, and an array of single-photon detectors, which output electrical pulses in response to photons that are reflected from the scene. An array of counters count the electrical pulses output by respective sets of the single-photon detectors during respective count periods. (Each such set may contain a single detector or a group of two or more mutually adjacent detectors.) Control circuitry sets the respective count periods of the counters to cover different, respective time intervals following each light pulse.

To enhance the short-range sensing capabilities of the device, the control circuitry sets the count period for each counter on the basis of the parallax shift affecting the corresponding set of detectors. In a typical configuration, light collection optics image the area of the target scene that is illuminated by any given beam onto a corresponding region of the detector array. Because of the transverse offset between the transmit and receive axes, this region is elongated due to parallax shift. In other words, objects illuminated by the beam at a short distance from the device are imaged onto one end of the region, and objects distant from the device are imaged onto the opposite end of the region, with intermediate distances imaged in between. (The control system typically has no a priori information as to the locations of objects in the scene and thus cannot determine in advance where within this region the reflected beam will be incident on the detector array.) For this reason, the control circuitry sets the count period of the counter that is coupled to the set of detectors at the short-distance end of the region to a time interval with an early start time following each illumination pulse, while setting the counter or counters that are coupled to the detectors at the long-distance end to a time interval with a later start time. The start times of the count periods of intermediate-distance counters can be graduated between those at the two ends.

The later start time of the counters at the long-distance end of the region protects these counters from errors due to short-range reflections, such as reflections of stray light within the depth sensing device. These counters can be used, for example, to count the electrical pulses in different time bins and thus construct a histogram of the pulses output by the corresponding detectors. This histogram is used to measure the depth of more distant objects based on the time of flight.

On the other hand, the counters in the shorter-distance parts of the region can be set to aggregate and count all electrical pulses during the respective count periods. These counters thus measure the total intensity of reflected photons that are incident on each of the detectors in the region. As a result of parallax, the point of highest intensity corresponds to the location of an object at a short distance from the device on which the given illumination beam is incident.

The transverse displacement of this point within the corresponding region of the detector array can be used to measure the depth of the object by triangulation.

Thus, the control circuitry is able to compute an accurate depth map of the target scene, in which distant objects are mapped based on ToF, and nearby objects are mapped by triangulation. This scheme makes more effective use of detection resources and, in particular, achieves better short-range performance in comparison with devices that use ToF alone. Rather than being a source of inaccuracy, as in bistatic ToF-based devices that are known in the art, the parallax arising due to the transverse offset between transmit and receive axes becomes an advantage, enabling more accurate, robust depth mapping in the present embodiments.

Although the embodiments that are shown in the figures and described hereinbelow relate, for the sake of concreteness and clarity, to a specific configuration of a depth mapping system, the principles of the present invention may alternatively be applied in enhancing the performance of other bistatic optical sensing devices. All such alternative implementations are considered to be within the scope of the present invention.

System Description

FIG. 1 is a schematic side view of a depth mapping device 20, in accordance with an embodiment of the invention. Device 20 comprises a light source, identified as a transmitting (Tx) laser projector 22, and a receiving (Rx) camera 24, with respective optical axes 26 and 28 that are offset transversely by a baseline offset B, as shown in the figure.

Tx laser projector 22 comprises an array 30 of emitters, such as a monolithic array of vertical-cavity surface-emitting lasers (VCSELs), which emit respective beams of light pulses. Collimating optics 32 project these beams at different, respective angles, toward corresponding areas of a target scene. To increase the number of projected beams in the pictured embodiment, a diffractive optical element (DOE) 34 splits the projected beam pattern into multiple adjacent or overlapping copies, thus creating a denser pattern of spots extending over the target scene. A cover window 36 of the device includes a filter 38, for example an infrared (IR) filter, in order to prevent light outside the optical working range from exiting and entering the device.

Rx camera 24 comprises an array 40 of single-photon detectors, which are configured to output electrical pulses in response to photons that are incident thereon. In the present embodiment, the sensing elements comprise SPADs, for example, so that the output signals are indicative of respective times of arrival of photons on the sensing elements. Light collection optics 42 image the target scene onto the SPAD array, while a bandpass filter 44 blocks incoming light that is outside the emission band of the Tx laser projector.

Each of the beams emitted by Tx laser projector 22 illuminates a corresponding area of the target scene, and light collection optics 42 image this area onto a certain, respective region of SPAD array 40. An array of counters (shown in FIG. 4) count, during respective count periods, the electrical pulses that are output by respective sets of one or more of the SPADs. Control circuitry (shown in FIGS. 2 and 3) sets the respective count periods of the counters to cover different, respective time intervals following each of the light pulses output by laser projector 22.

The selection of the count periods takes into account, inter alia, the parallax due to the offset between Tx and Rx axes 26 and 28. As explained earlier, this parallax gives rise to a transverse shift in the location on SPAD array 40 onto which the spot due to a given laser beam is imaged, depending upon the distance from device 20 to the area of the target scene that is illuminated by the beam. This parallax shift is illustrated, for example, by the beams that are reflected from a near object 46 and a distant object 48 in FIG. 1. The relation between the parallax shift and the count periods is described further with reference to the figures that follow.

Although the embodiments shown in the figures and described herein refer to the particular design of depth mapping device 20, the principles of the present invention may similarly be applied, mutatis mutandis, to other sorts of optical sensing devices that use an array of sensing elements, for both depth mapping and other applications. For example, Tx laser projector 22 may comprise a scanner, which scans a single beam or an array of multiple beams over the target scene. As another example, Rx camera 24 may contain detectors of other sorts. All such alternative embodiments are considered to be within the scope of the present invention.

Figure 2:
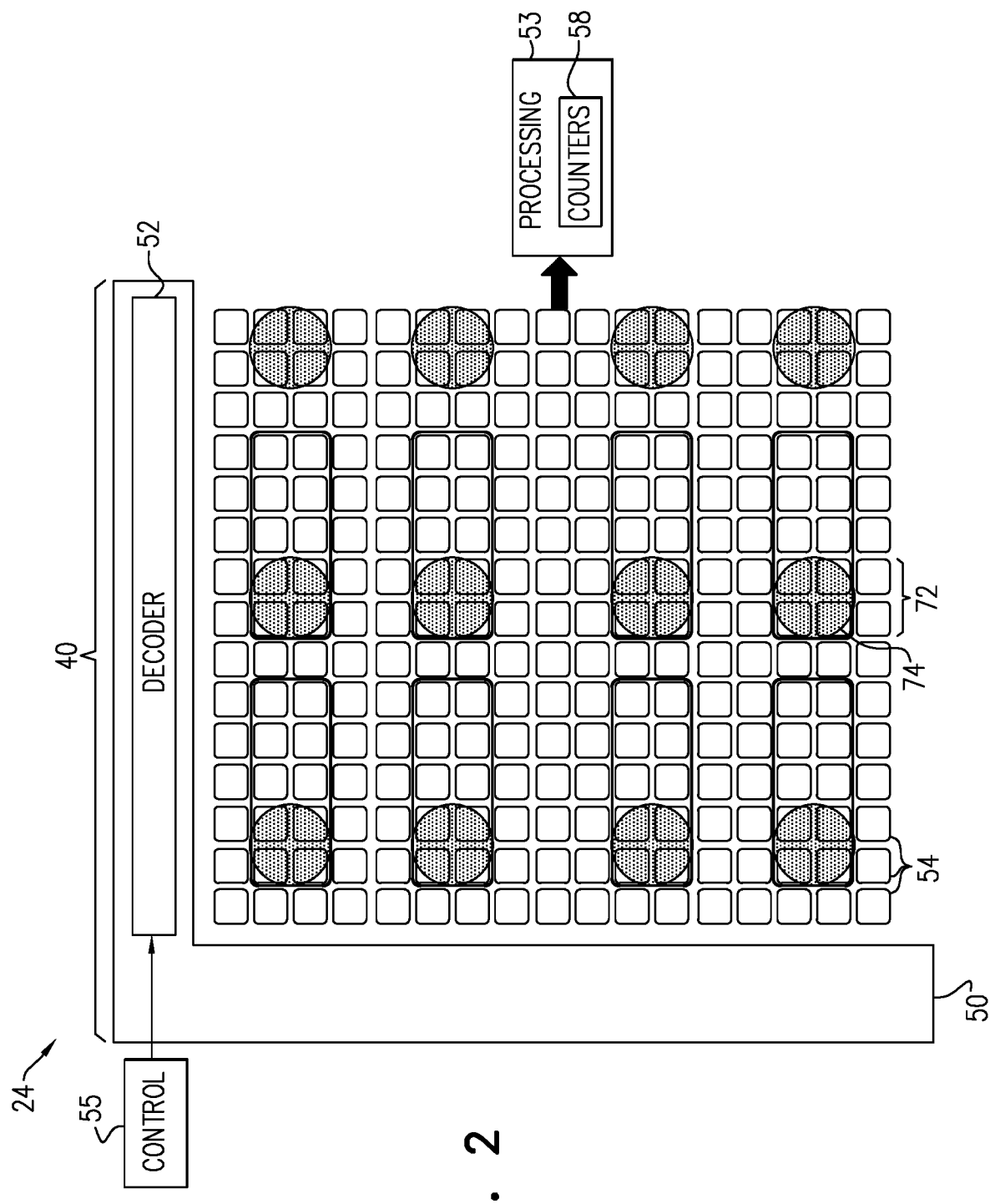
FIG. 2 is a block diagram that schematically illustrates a SPAD array and associated circuitry, in accordance with an embodiment of the invention.

FIG. 2 is a block diagram that schematically shows details of Rx camera 24, in accordance with an embodiment of the invention. In this embodiment, SPAD array 40 comprises a matrix of SPADs 54, along with integrated addressing logic 50 and processing circuits 53, including an array of counters 58. A controller 55 interacts with decoders 52 in addressing logic 50 in order to couple each counter 58 to a set of one or more SPADs 54 and to set the respective count periods of the counters relative to the time of emission of the light pulses by laser projector 22 (FIG. 1).

Addressing logic 50, processing circuits 53 (including counters 58), and controller 55 serve collectively as the control circuitry of device 20. These components of the control circuitry may be implemented, for example, using suitable hardware logic. Alternatively or additionally, at least some of the functions of the control circuitry may be implemented in software or firmware on a suitable programmable processor. Although some of these circuit elements are shown in FIG. 2, for the sake of clarity, as being separate from array 40, in practice they may be integrated with SPADs 54 within the area of the array.

Light collection optics 42 (FIG. 1) image a respective area of the target scene that is illuminated any given beam emitted by transmitter 22 onto a respective elongated region 74 of array 40 containing multiple SPADs 54. Regions 74 are elongated due to parallax shift, which causes the beam incident on near object 46 to be imaged onto one end of the region (the right end in the present example), and the same beam incident on distant object 48 to be imaged onto the opposite (left) end of the region. This effect is shown graphically in FIG. 3. The count periods of counters 58 that are coupled to SPADs 54 at the right end of region 74 will be set to start at an earlier time following each of the light pulses than the counters coupled to the SPADs at the left end. This relation is explained in detail hereinbelow with reference to FIG. 5.

Typically, each of counters 58 aggregates and counts the electrical pulses that are output by a respective set of two or more mutually-adjacent SPADs 54 in array 40. For example, at the left (long-range) end of each region 74, a set of four SPADs 54 may be grouped together to define a super-pixel 72. Counters 58 count the pulses that are output by the SPADs in super-pixel 72 in each of a succession of time bins within a certain count period following each emitted light pulse. Processing circuits 53 build a histogram of the counts per bin in each super-pixel over a series of transmitted pulses. Based on these histograms, processing circuits 53 compute a ToF value for each super-pixel (given by the mode of the histogram, for example), thus defining the depth values for the more distant parts of the target scene.

In the remaining short-range part of each region 74, counters 58 aggregate and count the total number of pulses output within an appropriate count period by their respective sets of SPADs 54 in order to derive intensity values. Processing circuits 53 use the locations of the intensity values in defining depth values for the nearer parts of the target scene by triangulation.

Figure 3:
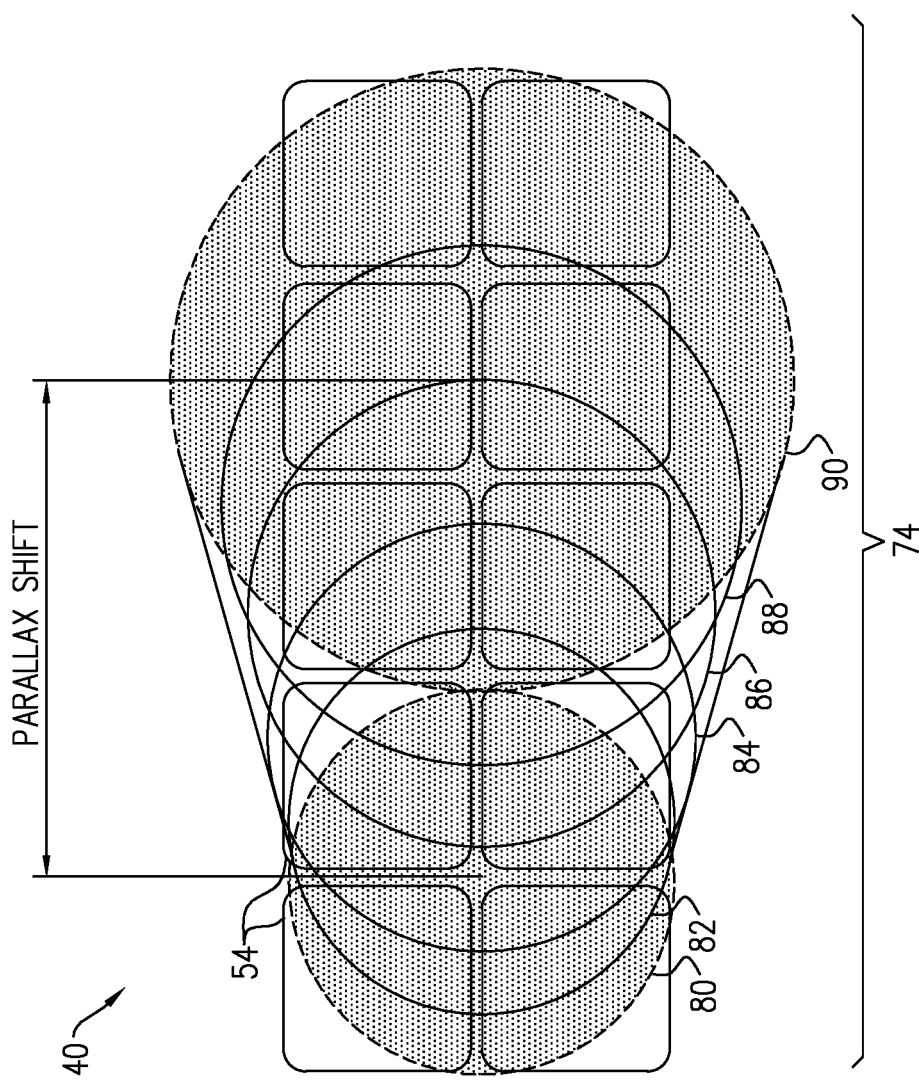
FIG. 3 is a schematic frontal view of reflected laser spots imaged onto elements of a SPAD array, in accordance with an embodiment of the invention.

FIG. 3 is a schematic frontal view of reflected laser spots 80, 82, 84, 86, 88, 90 imaged from an area of a target scene onto SPADs 54 in array 40, in accordance with an embodiment of the invention. This figure shows the effects of parallax on the size and location of region 74 of the SPAD array onto which the spot produced by a given laser beam is imaged by collection optics 42, as a function of the distance of the area of the target scene illuminated by the laser beam from depth mapping device 20. The figure assumes a certain baseline offset (B) between Tx and Rx axes 26 and 28 (FIG. 1). The "pixels" in the figure correspond to individual SPADs 54 in the array. The distance to the target scene can vary by two orders of magnitude or more.

Spot 80, at the left side of FIG. 3, represents the image formed on SPAD array 40 when the laser beam is incident on an area of the target scene that is distant from depth mapping device 20, for example 5 m away; whereas spot 90 at the right side represents the image when the beam is incident on an area near device 20, for example 15 cm away. The center of spot 90 has shifted relative to spot 80 by about 2.5 pixels due to parallax. For closer areas of the target scene, the parallax shift will be even greater.

These specific results are a function of the optical properties and geometrical dimensions of a specific depth mapping device, but the principles of defocus and shift will apply to other depth mapping devices of similar configuration. For example, a larger value of B will increase the length of region 74 and may thus enhance the accuracy of device 20 in measuring distances to nearby objects.

Control of Count Periods

Figure 4:
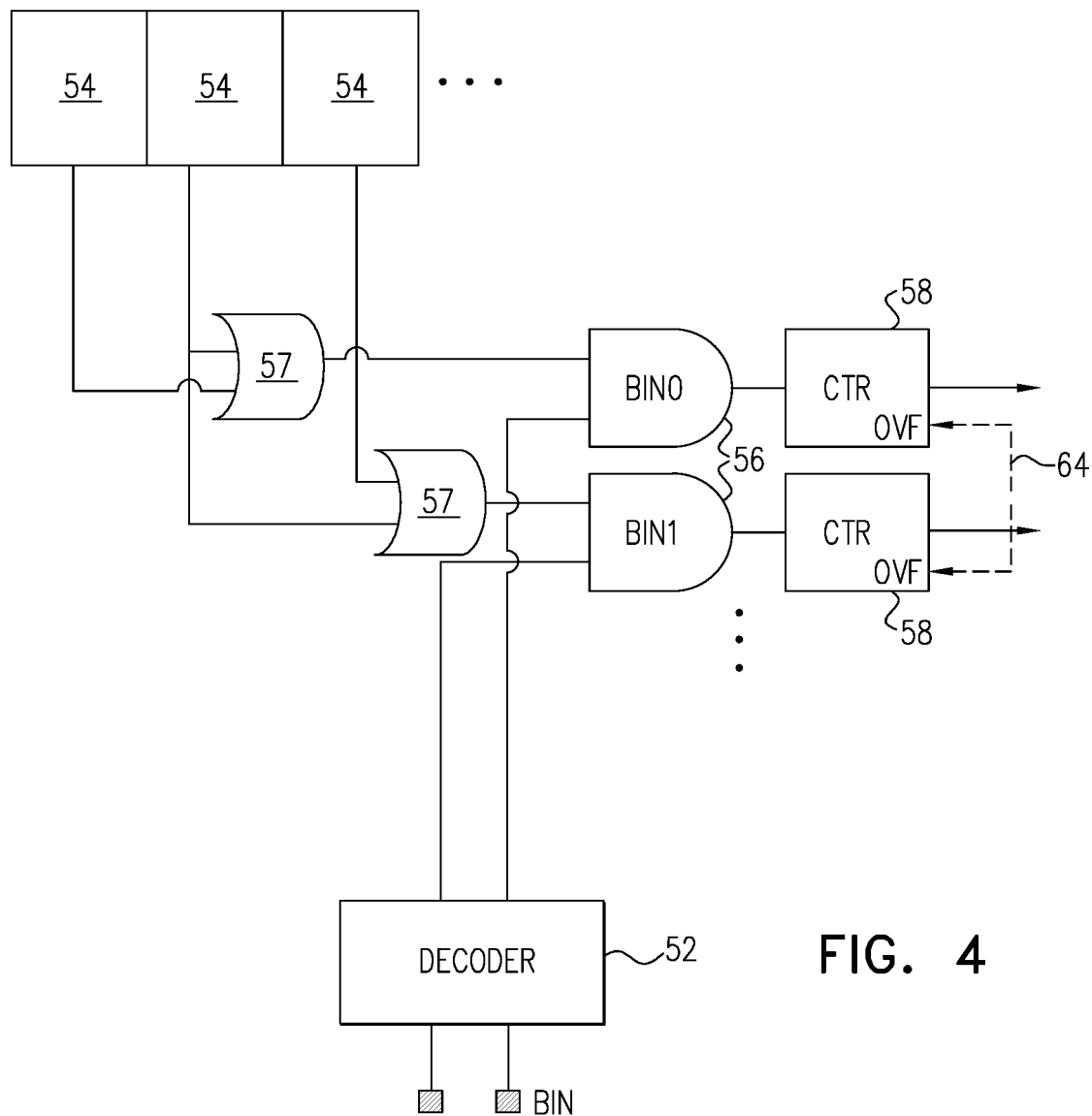
FIG. 4 is a schematic circuit diagram illustrating counting logic associated with a SPAD array, in accordance with an embodiment of the invention.

FIG. 4 is a block diagram that schematically illustrates an operating configuration of counters 58 and associated control circuitry, in accordance with an embodiment of the invention. Combinatorial circuits 57 convey pulses output by SPADs 54 to counters 58. (For the sake of simplicity, only a small subset of the SPADs and associate circuits are shown in the figure.)

Controller 55 may configure decoder 52 and counters 58, for example, to generate a multi-bin histogram of the times of arrival of photons that are incident on a given super-pixel 72 (FIG. 2). In this case, the outputs of all of SPADs 54 in super-pixel 72 are aggregated and input to AND gates 56. Decoder 52 triggers AND gates 56 to feed the electrical pulses that are output by the SPADs to respective counters 58 in different, respective time bins, at different respective delays relative to the optical pulses from projector 22. Counters 58 are interconnected by an overflow line 64, which stops all of the counters when one of them reaches saturation.

Based on the histogram generated by counters 58, processing circuits 53 compute the times of flight of the optical pulses that are emitted from projector 22 and reflected back to each super-pixel 72. The processing circuits combine the TOF readings from the various super-pixels in array 40 in order to compute the ToF components of a 3D map of the target scene. These ToF components typically cover the parts of the target scene that are relatively more distant from device 20.

On the other hand, for SPADs at the short-distance end of region 74, decoder 52 sets AND gates 56 so that counters 58 receive and count all the pulses that are output by each SPAD 54 or a set of adjacent SPADs within a certain count period. In this mode, the count periods are set based on the depth of objects that are expected to be imaged onto the corresponding SPADs, so that each counter 58 will count the electrical pulses output by the corresponding SPADs during the interval in which optical pulses reflected from the objects are expected to reach array 40. The respective count periods of different counters 58 may overlap with one another, in order to optimize collection of photons from the entire spot 82, 84, 86, 88, 90 (as illustrated in FIG. 3) while reducing the count of ambient photons that are not the result of short-range reflections. The count periods and time overlaps are set based on the expected parallax and spot size at the range that each SPAD is expected to sense. Processing circuits 53 can thus construct a high-resolution 2D image, with low levels of background interference and noise, showing the locations of the projected beams that are incident on such objects. The processing circuits use these locations in computing the triangulation component of the 3D map, typically covering the parts of the target scene that are closer to device 20.

Figure 5:
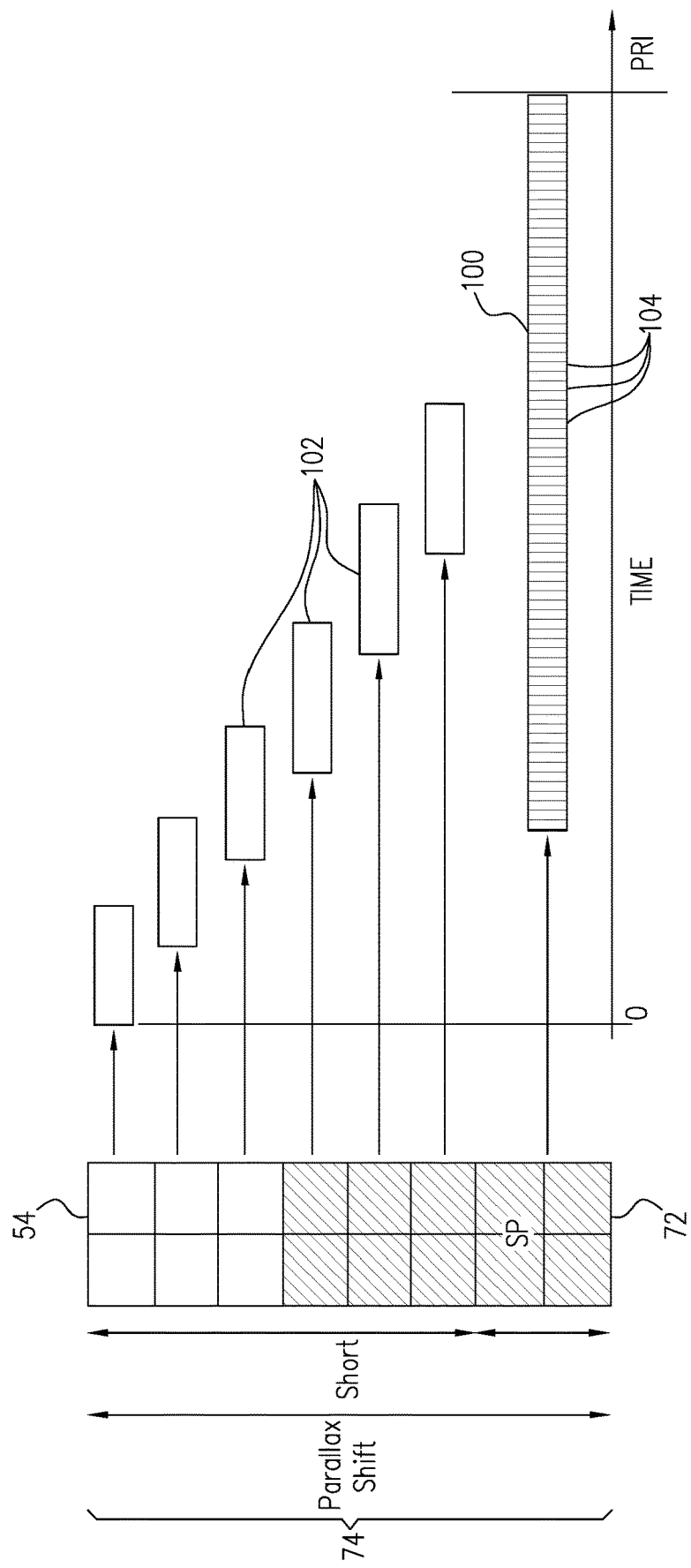
FIG. 5 is a timing diagram that schematically illustrates a gating and binning scheme implemented by counting logic, in accordance with an embodiment of the invention.

FIG. 5 is a timing diagram that schematically illustrates a gating and binning scheme implemented by the control circuitry in device 20, in accordance with an embodiment of the invention. In this illustration, region 74 is rotated by 90° relative to the preceding figures to define the vertical axis of the diagram, with the short-distance part of the region at the upper end and super-pixel 72 for the long-distance part at the lower end. Region 74 is longer (in terms of pixels) in this example than in the preceding examples. The horizontal axis represents the time intervals covered by respective count periods 100, 102 of the counters that are coupled to each of the sets of SPADs 54 in region 74, relative to each light pulse emitted by projector 22 at time=0. This sequence of count periods is repeated periodically over a succession of pulse repetition intervals (PRIs) of the projector.

As illustrated in this diagram, the counters that are coupled to super-pixel 72 count the electrical pulses in different time bins 104 within count period 100 so as to generate a histogram of the electrical pulses. The counters that are coupled to the remaining sets of SPADs in region 74 count all the electrical pulses in respective count periods 102. The start times of count periods 102 are graduated, from the earliest start time (immediately after the projected pulse) at the upper end of region 74 to later start times toward the lower end. Count periods 102 are chosen to cover the expected ranges of arrival time of reflected photons following the projected pulses as a function of location in region 74. Thus, for example, each count period 102 could have a duration of several nanoseconds and a start time 1-2 ns later than that of the count period of the SPADs just above it in region 74.

The particular geometries of device 20 and of regions 74 that are shown above were chosen by way of illustration. Alternative geometries, along with appropriate settings of corresponding count periods, will be apparent to those skilled in the art after reading the present description and are considered to be within the scope of the present invention. Various count periods may be allocated for measurements of total intensity or histograms or both.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical sensing device, comprising:
a light source, which is configured to emit one or more beams of light pulses toward a target scene at respective angles about a transmit axis of the light source;
a first array of single-photon detectors, which are configured to output electrical pulses in response to photons that are incident thereon;
a second array of counters, which are coupled to count the electrical pulses output during respective count periods by respective sets of one or more of the single-photon detectors;
light collection optics configured to form an image of the target scene on the first array along a receive axis, which is offset transversely relative to the transmit axis, thereby giving rise to a parallax shift as a function of distance between the target scene and the device; and
control circuitry, which is configured to set the respective count periods of the counters, responsively to the parallax shift, to cover different, respective time intervals following each of the light pulses.

2. The device according to claim 1, wherein the light collection optics are configured to image a respective area of the target scene that is illuminated any given beam among the one or more beams onto a respective region containing a plurality of the single-photon detectors in the first array, and the control circuitry is configured, responsively to the parallax shift, to apply the different time intervals in setting the counters that are coupled to different, respective sets of the single-photon detectors within the respective region.

3. The device according to claim 2, wherein the respective region in the first array is elongated due to the parallax shift, and the plurality of the singe-photon detectors includes at least a first single-photon detector at a first end of the elongated region and at least a second single-photon detector at a second end of the elongated region, opposite the first end, and
wherein the control circuitry is configured to initiate a first count period of a first counter that is coupled to the first single-photon detector at an earlier start time following each of the light pulses than a second count period of a second counter that is coupled to the second single-photon detector.

4. The device according to claim 3, wherein the control circuitry is configured to initiate the respective count periods of one or more of the counters that are coupled to one or more of the single-photon detectors that are disposed within the elongated region between the first and second single-photon detectors at respective start times that are graduated between the first and second count periods.

5. The device according to claim 3, wherein the control circuitry is configured to cause the first counter to aggregate and count all the electrical pulses output by the first single-photon detector during the first count period, while causing at least the second counter to count the electrical pulses in different time bins within the second count period so as to generate a histogram of the electrical pulses.

6. The device according to claim 3, wherein the elongated region in the first array is defined such that the light collecting optics image objects disposed at a short distance from the device within the respective area of the target scene that is illuminated by the given beam onto the first end of the elongated region, while imaging objects disposed at a long distance from the device within the respective area of the target scene that is illuminated by the given beam onto the second end of the elongated region.

7. The device according to claim 1, wherein the control circuitry is configured to process count values generated by the counters during the respective count periods in order to compute a depth map of the target scene using times of flight of the photons that are incident on the first array together with triangulation based on the parallax shift.

8. The device according to claim 1, wherein the single-photon detectors comprise single-photon avalanche diodes (SPADs).

9. The device according to claim 1, wherein the light source comprises a plurality of emitters, which are configured to emit a corresponding plurality of the beams concurrently toward different, respective areas of the target scene.

10. The device according to claim 1, wherein each of the counters is configured to aggregate and count the electrical pulses output by a respective set of two or more of the single-photon detectors that are mutually adjacent in the first array.

11. A method for optical sensing, comprising:
emitting one or more beams of light pulses toward a target scene at respective angles about a transmit axis;
forming an image of the target scene on a first array of single-photon detectors along a receive axis, which is offset transversely relative to the transmit axis, thereby giving rise to a parallax shift as a function of distance to the target scene;
counting electrical pulses that are output by respective sets of one or more of the single-photon detectors in response to photons that are incident thereon during respective count periods; and
setting the respective count periods, responsively to the parallax shift, to cover different, respective time intervals following each of the light pulses.

12. The method according to claim 11, wherein forming the image comprises imaging a respective area of the target scene that is illuminated by any given beam among the one or more beams onto a respective region containing a plurality of the single-photon detectors in the array, and wherein setting the respective count periods comprises applying the different time intervals, responsively to the parallax shift, in setting counters that are coupled to different, respective sets of the single-photon detectors within the respective region.

13. The method according to claim 12, wherein the respective region in the first array is elongated due to the parallax shift, and the plurality of the singe-photon detectors includes at least a first single-photon detector at a first end of the elongated region and at least a second single-photon detector at a second end of the elongated region, opposite the first end, and
wherein applying the different time intervals comprises initiating a first count period of a first counter that is coupled to the first single-photon detector at an earlier start time following each of the light pulses than a second count period of a second counter that is coupled to the second single-photon detector.

14. The method according to claim 13, wherein applying the different time intervals comprises initiating the respective count periods of one or more of the counters that are coupled to one or more of the single-photon detectors that are disposed within the elongated region between the first and second single-photon detectors at respective start times that are graduated between the first and second count periods.

15. The method according to claim 13, wherein applying the different time intervals comprises causing the first counter to aggregate and count all the electrical pulses output by the first single-photon detector during the first count period, while causing at least the second counter to count the electrical pulses in different time bins within the second count period so as to generate a histogram of the electrical pulses.

16. The method according to claim 13, wherein the elongated region in the array is defined such that objects disposed at a short distance from the array within the respective area of the target scene that is illuminated by the given beam onto the first end of the elongated region, while imaging objects disposed at a long distance from the method within the respective area of the target scene that is illuminated the given beam onto the second end of the elongated region.

17. The method according to claim 11, wherein the method comprises processing count values generated during the respective count periods in order to compute a depth map of the target scene using times of flight of the photons that are incident on the array together with triangulation based on the parallax shift.

18. The method according to claim 11, wherein the single-photon detectors comprise single-photon avalanche diodes (SPADs).

19. The method according to claim 11, wherein emitting the one or more beams comprises operating a plurality of emitters to emit a corresponding plurality of the beams concurrently toward different, respective areas of the target scene.

20. The method according to claim 11, wherein counting electrical pulses comprises aggregating and counting the electrical pulses output by sets of two or more of the single-photon detectors that are mutually adjacent in the array.

* * * * *